United States Patent [19]

Chiwaki

[11] Patent Number: 4,488,223
[45] Date of Patent: Dec. 11, 1984

[54] CONTROL APPARATUS FOR A PLURALITY OF MEMORY UNITS

[75] Inventor: Yoshinori Chiwaki, Tokyo, Japan

[73] Assignee: Nippon Electric Co., Ltd., Tokyo, Japan

[21] Appl. No.: 377,000

[22] Filed: May 11, 1982

[30] Foreign Application Priority Data

May 14, 1981 [JP] Japan ................. 56-71471

[51] Int. Cl.³ ........................... G06F 11/00
[52] U.S. Cl. ................................. 364/200
[58] Field of Search ............. 364/183, 184, 186, 187, 364/200, 900; 365/201

[56] References Cited

U.S. PATENT DOCUMENTS

| | | | |
|---|---|---|---|
| T932,005 | 3/1975 | Kruskal | 364/200 |
| 3,387,276 | 6/1968 | Reichow | 364/200 |
| 3,668,644 | 6/1972 | Looschen | 364/200 |
| 3,905,023 | 9/1975 | Perpiglia | 364/200 |
| 3,934,227 | 1/1976 | Worst | 364/200 |
| 3,950,729 | 4/1976 | Fletcher et al. | 364/200 |
| 4,010,450 | 3/1977 | Porter et al. | 364/200 |
| 4,044,337 | 8/1977 | Hicks et al. | 364/200 |
| 4,089,063 | 5/1978 | Takezono et al. | 364/200 |

Primary Examiner—Raulfe B. Zache
Assistant Examiner—William G. Niessen
Attorney, Agent, or Firm—Sughrue, Mion, Zinn, Macpeak and Seas

[57] ABSTRACT

In a data processing system of the type having a processor and a plurality of memory units, which can be accessed simultaneously by the processor, the processor writes simultaneously into both memory units and reads from a particular one of the memory units except when the particular memory unit exhibits an error condition in which case writing and reading are performed in a different memory unit. The switching from the master memory unit to an alternate memory is performed simultaneously with the error indication in the master memory unit during a write operation and is performed at the next clock pulse in a read operation so that a retry can be performed.

6 Claims, 11 Drawing Figures

CONTROL APPARATUS FOR A PLURALITY OF MEMORY UNITS

BACKGROUND OF THE INVENTION

This invention relates to a control apparatus for a plurality of memory units installed in a data processing system (hereunder referred to simply as a "DP system").

A prior art DP system of the type described includes a master memory unit currently in operation and a spare memory unit for future use. A hardware failure in a program storage area of the master memory unit results in a program error in an operating system (or OS) which is adapted to control the entire system. In response to the program error, the execution of the program is terminated. Then, the foiled master memory unit is logically cut off from the rest of the system and the terminated program is transferred to the other memory unit. A significant amount of time is consumed for the transfer of the program. The execution of the transferred program is retried and the system as a whole continues its operation. The data stored in the master memory unit include OS information, in addition to the normal program. Hence, a system-down condition is unavoidable once the master memory unit storing the OS information has a hardware failure. This will have a critical influence on the whole system particularly when the DP system is applied to an online system with a high requirement for reliability. In light of this, where a hardware failure is of the intermittent nature, practising the program transferred to the other memory unit is retried. Where a hardware failure is not of the intermittent nature but is constant, a system-down condition cannot be avoided even though the retry operation may be performed. To eliminate the system-down condition, there is proposed in Japanese Laid Open Patent Application No. 80936/1974 a DP system which causes first and second memory units into parallel operation by simultaneous access. In this system, a read cycle and a write cycle are designed identical to each other to maintain full continuity of operation of the system. When the system detects a hardware failure in response to a status signal during a read mode operation, the data transmission from the failing memory unit to a processor must be switched to that from the other memory unit. A time period for this switching action is selected in proportion to the maximum width of data to be read and shorter than the period of system control clock pulses. Accordingly, since the read cycle is made longer in proportion to the data width, the write cycle also becomes longer resulting in a significant decrease in the processing rate.

SUMMARY OF THE INVENTION

It is one object of the present invention to provide a control apparatus for a plurality of memory units of a highly reliable DP system free from the drawbacks discussed above and with the capability of enhanced performance by utilizing the retry function of a processor for ensuring the continuity of operation.

According to one aspect of the invention, there is provided a control apparatus for a DP system, which comprises:

a plurality of memory units;

memory unit access means to which said memory units are accessible simultaneously;

a plurality of error holding circuits, each of which continuously produces a status error signal in response to an error indication made by a status signal from a corresponding memory unit;

control means for generating a write command signal in response to a request from a processor;

status selection commanding means responsive to the write command signal from said control means, a status error signal from one of the error holding circuits, and a master designating signal externally given to designate one of said memory units as a master memory unit, for producing a status selection signal simultaneously with the generation of said status error signal during a write mode operation, while producing a status selection signal in response to the next clock pulse after the generation of the status error signal during a read mode operation; and status selector means for returning one of the status signals given from the memory units to the processor as a status notifying signal in response to the output of the status selection commanding means.

BRIEF DESCRIPTION OF THE DRAWING

The present invention will be described in detail with reference to the accompanying drawings in which.

It should be noted that in the drawings the same reference numerals denote the same structural elements and that circles marked at the input terminals or output terminals of various gates indicate inverted inputs or inverted outputs.

DETAILED DESCRIPTION OF THE PREFERRED EMBODIMENT

Figure 1:
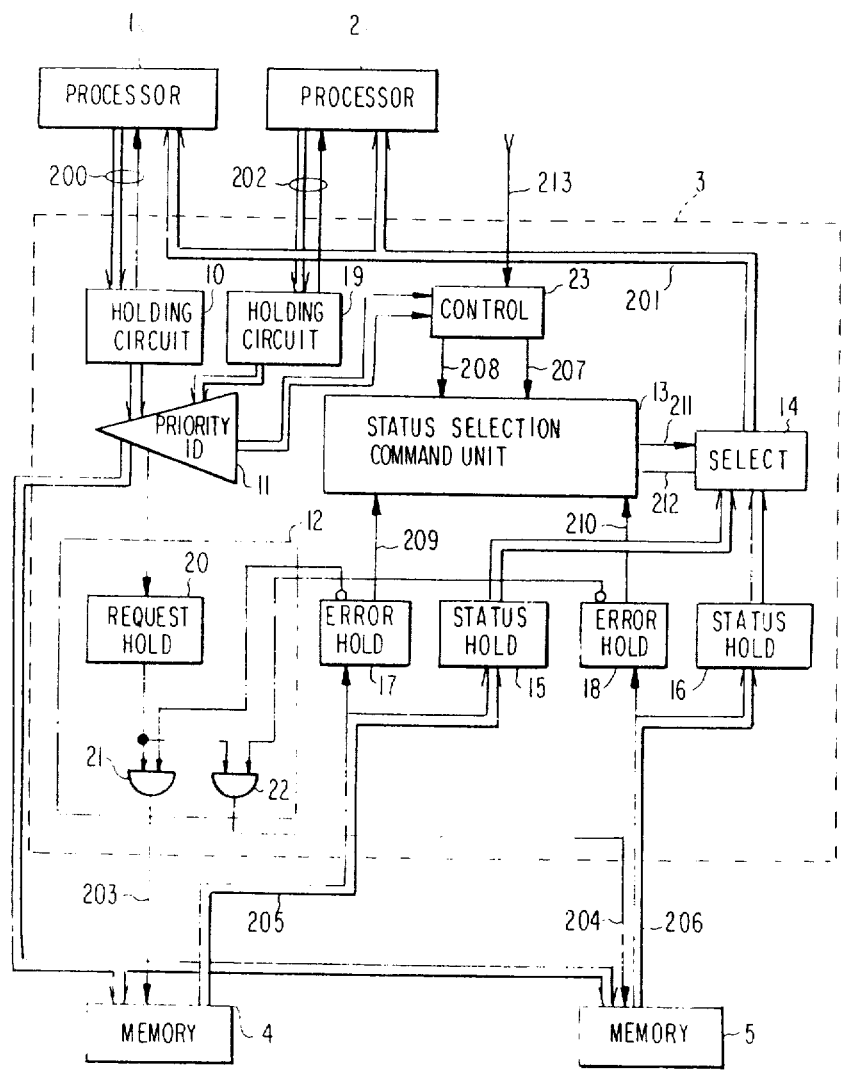
FIG. 1 is a block diagram showing one embodiment of the present invention.

Referring to FIG. 1, a data processing system to which the present invention is applicable comprises processors 1 and 2, a control apparatus 3 embodying the present invention, and memory units 4 and 5.

The processors 1 and 2 produce memory access request signals which can have simultaneous access to the units 4 and 5 through lines 200 and 202 and the apparatus 3 to cause data to be read from or written in the units 4 and 5 at the same time. The apparatus 3 receives status signals from the individual units 4 and 5 through lines 205 and 206 and feeds either one of them as a status notifying signal back to the processors 1 and 2 through a line 201.

Each processor 1 or 2 may have the construction illustrated in FIG. 1 of U.S. Pat. No. 3,656,123 and each memory unit 4 or 5 the construction shown in FIGS. 1A and 2 of U.S. Pat. No. 3,796,996. It should be born in mind that the embodiment of the present invention discussed hereinafter is operated in response to system clock pulses which will be described later.

The control apparatus 3 of the invention is made up of holding circuits 10 and 19, a priority identifying circuit 11, a memory access unit 12, a status selection command unit 13, a selector 14, status holding circuits 15 and 16, error holding circuits 17 and 18 and a control circuit 23. The circuit 10 receives and holds an access request, address, and data fed from the processor 1 through the line 200. The circuit 19, on the other hand, receives and holds an access request, address, and data fed from the other processor 2 through the line 202. The circuit 11 determines the priority order of the access requests from the processors 1 and 2. The memory access unit 12 comprises a request holding circuit 20 and AND gates 21 and 22. After holding a request signal having the highest priority from the circuit 11, the memory access unit 12 is allowed to have access simultaneously to the units 4 and 5 through lines 203 and 204 if both the units 4 and 5 are normal. However, if either one of the units 4 and 5 has failed, the unit 12 is allowed to have access only to the normal memory unit 4 or 5. In more detail, each AND gate 21 or 22 receives the output of the circuit 20 at its one input terminal and a negative output signal of the circuit 17 or 18 at its other input terminal. In response to the input signals, the AND gate 21 supplies the unit 4 with an access request signal through the line 203 while the AND gate 22 supplies the unit 5 with an access request signal through the line 204. Where neither of the circuits 17 or 18 is holding a status error signal, both the AND gates 21 and 22 are open to pass the output of the circuit 20 to the units 4 and 5 at the same time. Once an error is generated, for example, in the unit 4 so that the status signal fed to the circuit 17 through the line 205 indicates an error, the negative output of the circuit 17 becomes "0" whereby the AND gate 21 is closed. The data is read from or written in the unit 5 only, with the unit 4 held entirely inoperative. The holding circuits 15 and 16 are adapted to hold status signals given thereto from the units 4 and 5 through the lines 205 and 206, respectively. A circuit (not shown) installed in the units 4 and 5 for generating such status signals may comprise the register 23 and bus 44 shown in FIG. 1 of U.S. Pat. No. 3,814,922.

When the status signal from the unit 4 or 5 indicates an error, the circuit 17 or 18 continuously supplies the command unit 13 with a status error signal through a line 209 or 210 until a reset command signal is sent thereto from the outside. The unit 13 feeds a selection command signal to the selector 14, in response to a signal delivered from the control circuit 23 through a line 207 for designating a master memory unit, a write command signal supplied from the circuit 23 through a line 208, and a status error signal supplied from the circuit 17 or 18 through the line 209 or 210.

Figure 2:
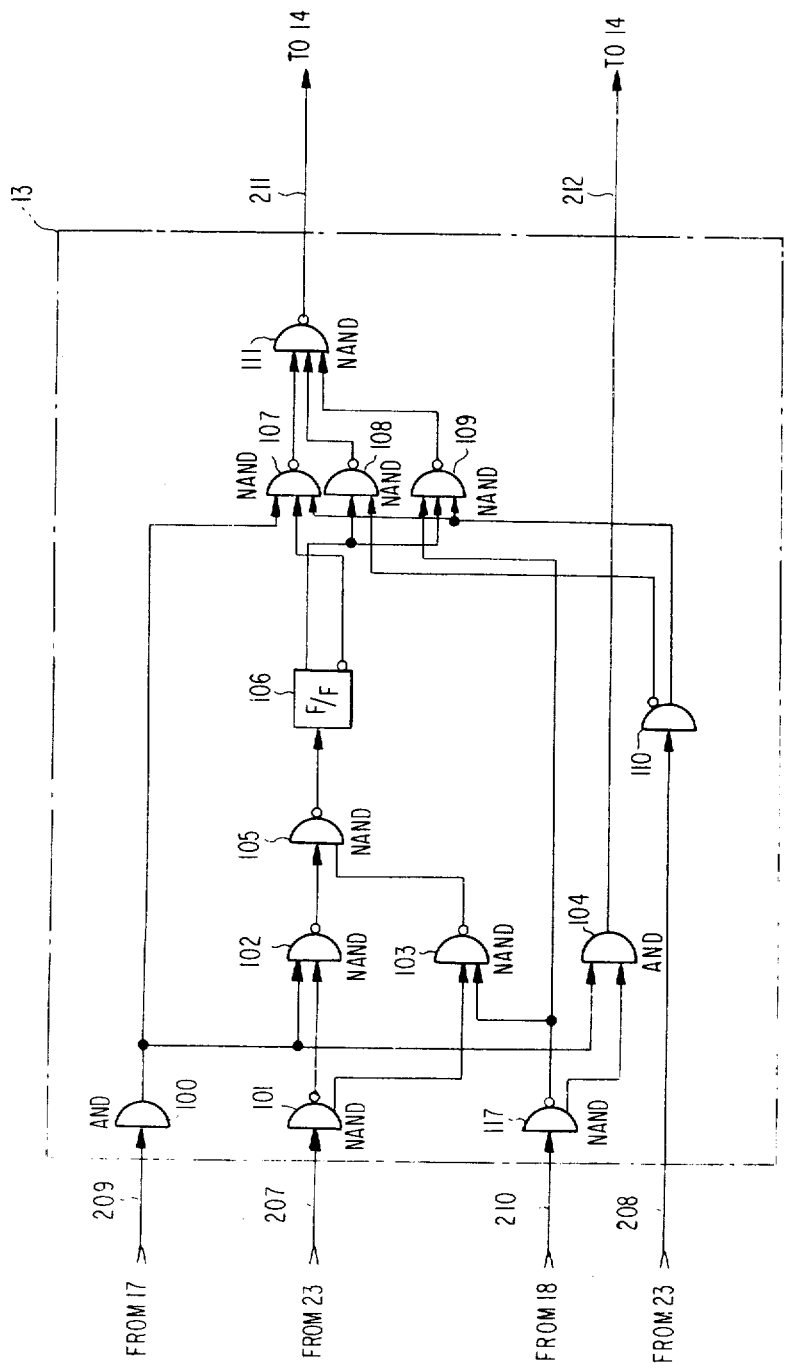
FIGS. 2 and 3 are diagrams showing details of different parts of the circuit arrangement illustrated in FIG. 1.

Referring to FIG. 2, the status selection command unit 13 is composed of a flip-flop (F/F) 106 and gates 100 to 105, 107 to 111 and 117. The status error signal from the circuit 17 or 18 is given to the corresponding gate 100 or 117 via the line 209 or 210. A master designating signal is supplied from the outside to the gate 101 by way of the line 207 and the write command signal to the gate 110 via the line 208. The output of the AND gate 100 is fed to the NAND gate 102, AND gate 104, and NAND gate 107. In response to an input signal, the NAND gate 117 supplies a positive output to the other input of the AND gate 104 and a negative output to the NAND gates 103 and 109. The NAND gate 103 receives at its other input the positive output signal of the NAND gate 101. The negative output of the gate 101 is sent to the other input of the NAND gate 102. The outputs of the NAND gates 102 and 103 are supplied to the NAND gate 105 so that the F/F 106 is driven in response to the output of the NAND gate 105. The F/F 106 is of the D-type which produces the logical state of an input signal in response to the next clock pulse, and output of the F/F 106 is fed to the NAND gates 108 and 109. The other input of the NAND gate 108 is connected to the negative output terminal of the gate 110. The positive output terminal of the gate 110 is connected to the NAND gates 109 and 107. Also, the NAND gate 107 is coupled to the negative output terminal of the F/F 106. The outputs of the NAND gates 107, 108 and 109 are fed to the NAND gate 111, and output of the gate 111 is fed through a line 211 as a status selection signal. The output of the AND gate 104 is fed through a line 212 as a status inhibition signal. The various input and output signals mentioned are interrelated as shown in Truth Table below.

TRUTH TABLE

| 207 | 209 | 210 | 208 | 211 | 212 |
|-----|-----|-----|-----|-----|-----|
| 0 | 0 | 0 | X | 0 | 0 |
| 1 | 0 | 0 | X | 1 | 0 |
| 0 | 1 | 0 | 0 | 0→1 | 0 |
| 0 | 1 | 0 | 1 | 1 | 0 |
| 0 | 1 | 1 | X | X | 1 |
| 1 | 0 | 1 | 0 | 1→0 | 0 |
| 1 | 0 | 1 | 1 | 0 | 0 |
| 1 | 1 | 1 | X | X | 1 |

In the Truth Table, "0→1" indicates that "0" turns into "1" in response to the next system clock pulse, while "1→0" indicates that the "1" turns into "0" in response to the next system clock pulse. "X" indicates that the logical value may be either of "0" or "1."

Figure 3:
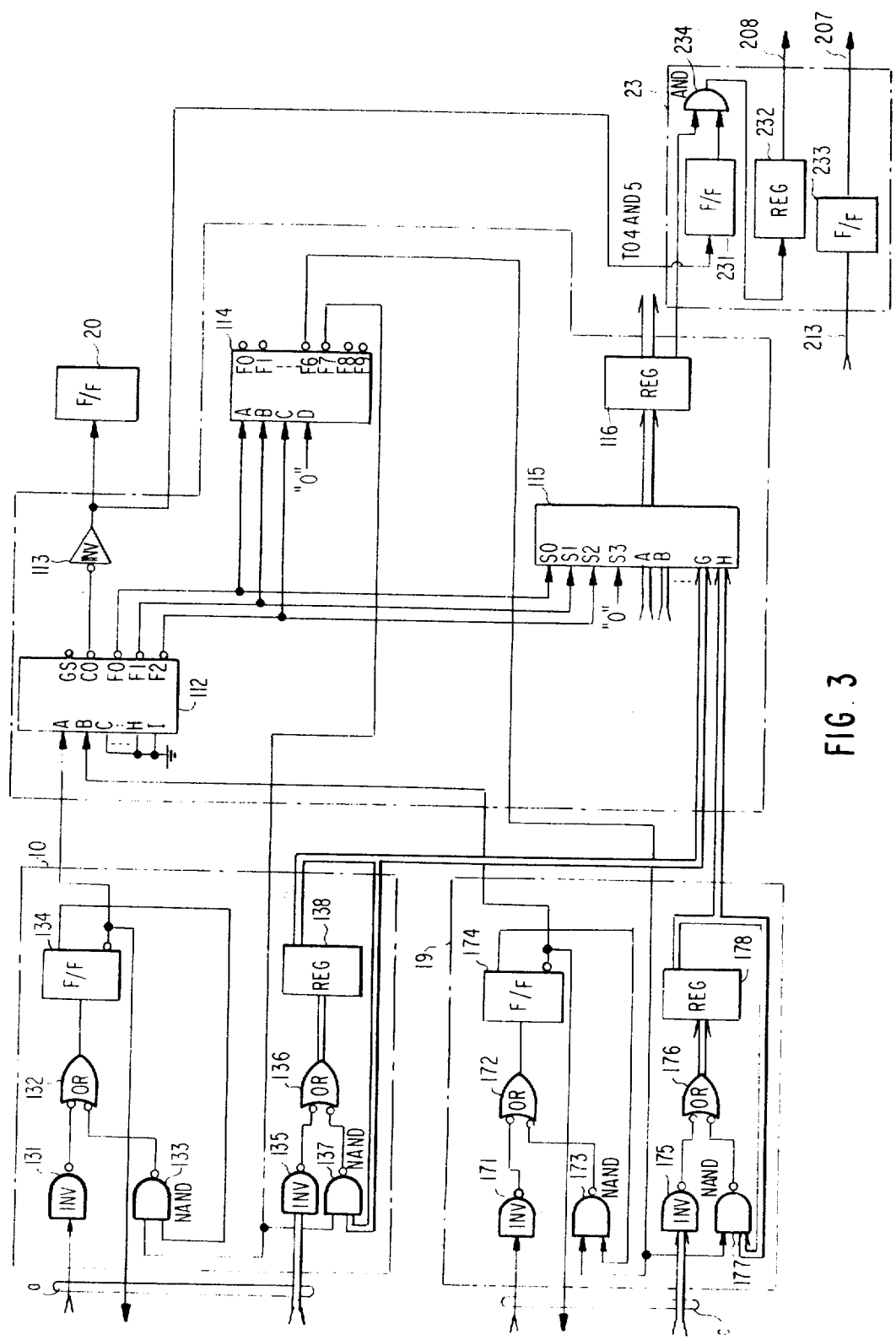

Referring to FIG. 3, the holding circuit 10 shown in FIG. 1 comprises a F/F 134 and its associated gates 131 to 133 for receiving an access request and inhibiting the next request from the processor 1, and a register 138 and its associated gates 135 to 137 for receiving data and address request from the processor 1 and supplying them to the priority identifying circuit 11. The holding circuit 19 comprises a F/F 174 and its associated gates 171 to 173 and a register 178 and its associated gates 175 to 177.

The circuit 11 comprises a priority encoder 112, an inverter 113, a decoder 114, a multiplexer 115, and a F/F 116. The control circuit 23 is composed of a F/F 231, a shift register 232, a F/F 233, and an AND gate 234.

Figure 4:
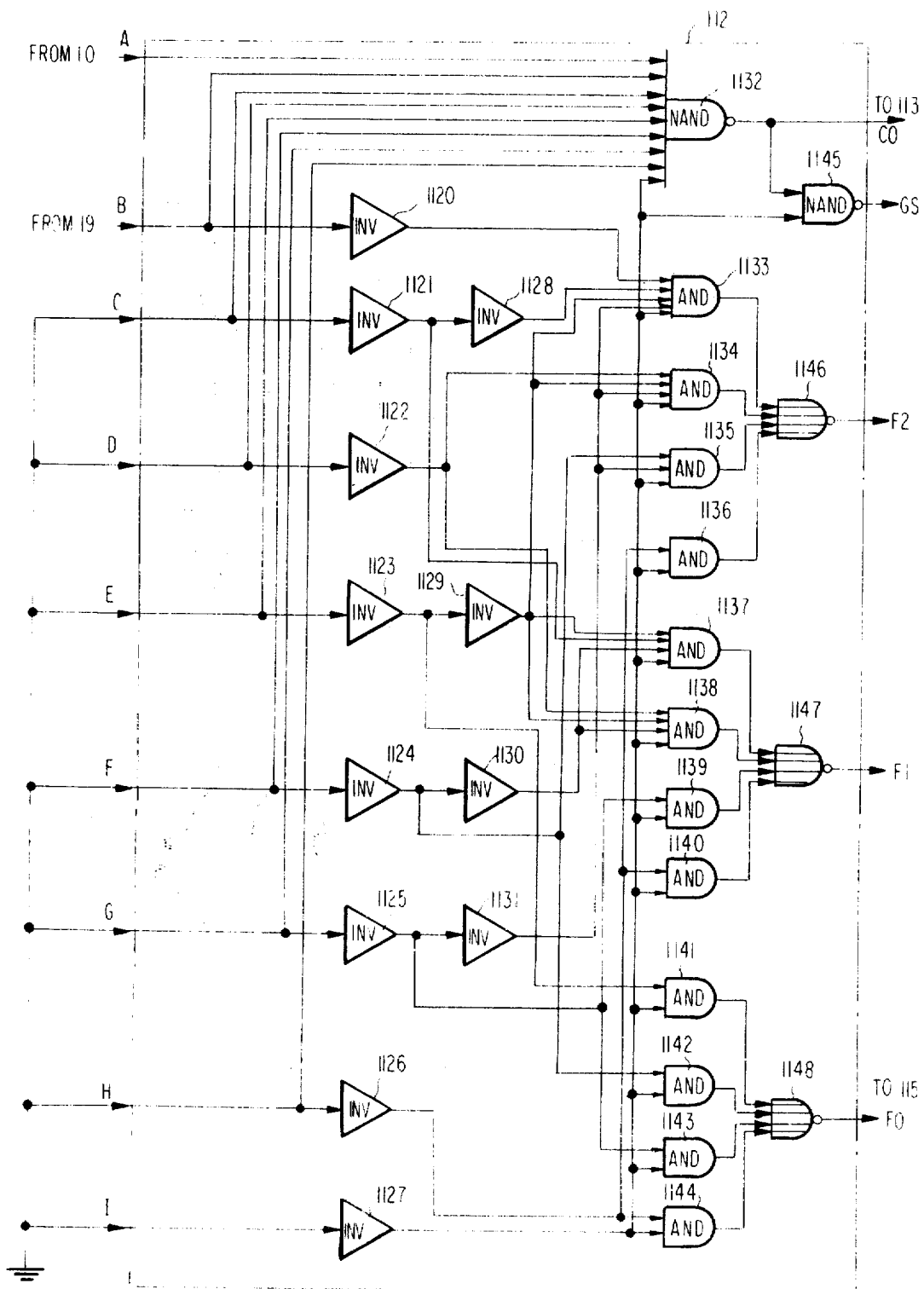
FIGS. 4 to 6 are diagrams showing further details of different parts of the circuitry indicated in FIG. 3.

Referring to FIG. 4, the encoder 112 is composed of inverters 1120 to 1131, AND gates 1133 to 1144, NAND gates 1132 and 1145, and OR gates 1146 to 1148. The encoder 112 determines the priority order and codes it in response to access request signals from the circuits 10 and 19, thereafter supplying a selection command to the multiplexer 115. The input terminal A is connected to the circuit 10 and the input terminal B is connected with the circuit 19, while the input terminals C to I are grounded.

Figure 5:
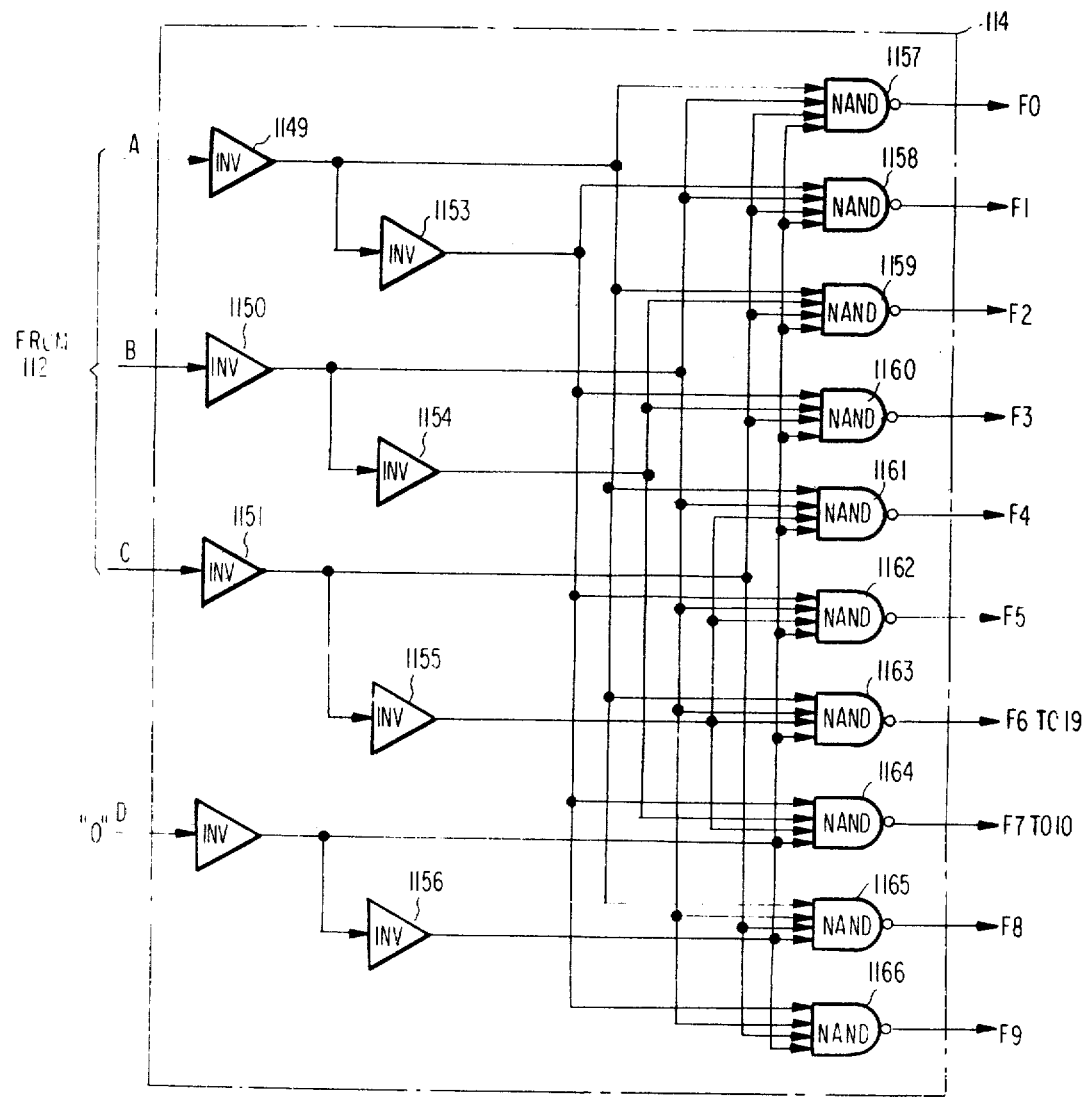

Details of the decoder 114 are shown in FIG. 5. The decoder 114 comprises inverters 1149 to 1156 and AND gates 1157 to 1166 and functions to decode the coded output of the encoder 112. The decoded data is partly fed back to the circuits 10 and 19 which then have their F/F's 134 and 174 reset.

Figure 6:
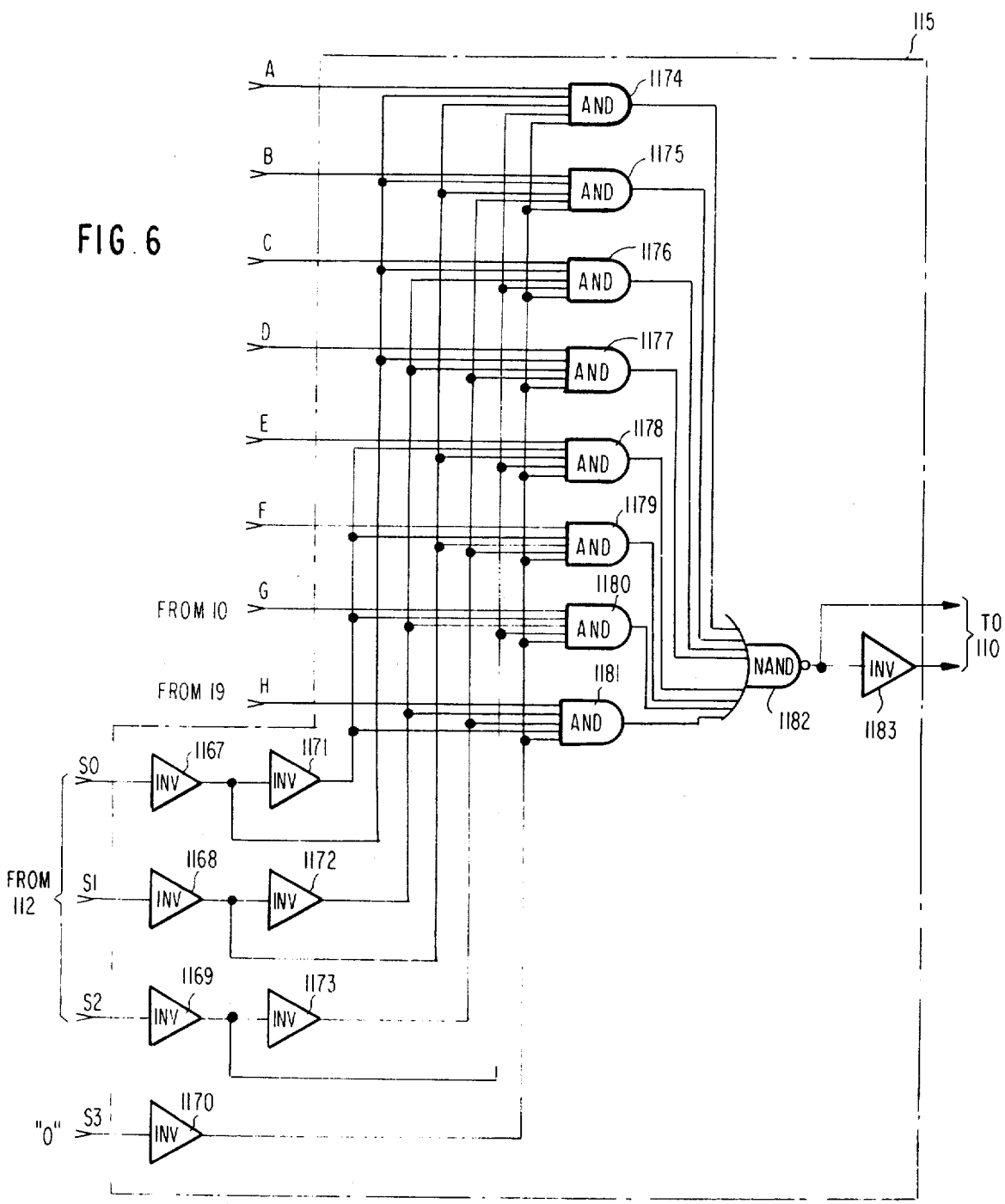

Details of the multiplexer 115 are shown in FIG. 6. The multiplexer 115 includes inverters 1167 to 1173 and 1183, AND gates 1174 to 1181 and a NAND gate 1182. In response to a selection command from the encoder 112, the multiplexer 115 selects one of the data given from the circuits 10 and 19.

Figure 7:
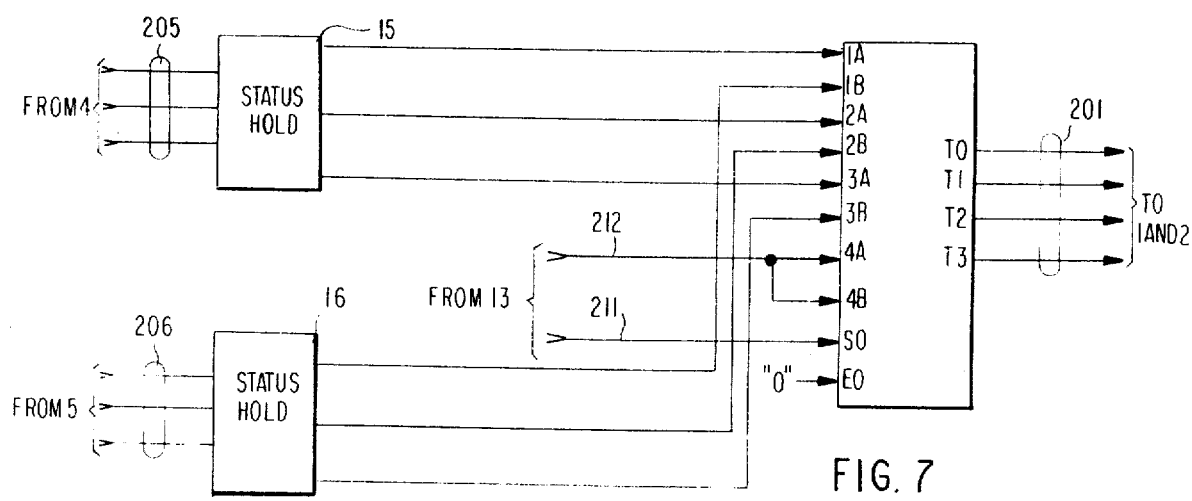
FIG. 7 is a diagram showing another part of the circuit arrangement of FIG. 1 in detail.

Referring to FIGS. 1 and 7, a set of three lines 205 are connected to the status holding circuit 15 and a set of three lines 206 are connected to the other status holding circuit 16. Three lines connect the output terminals of the circuit 15 to corresponding input terminals 1A, 2A and 3A of the selector 14. Likewise, three lines connect the output terminals of the circuit 16 to corresponding input terminals 1B, 2B and 3B of the selector 14. The selector 14 produces a status notifying signal on lines 201 which are connected with output terminals $T_0$ to $T_3$, and the status notifying signal is then supplied to the processors 1 and 2.

Figure 8:
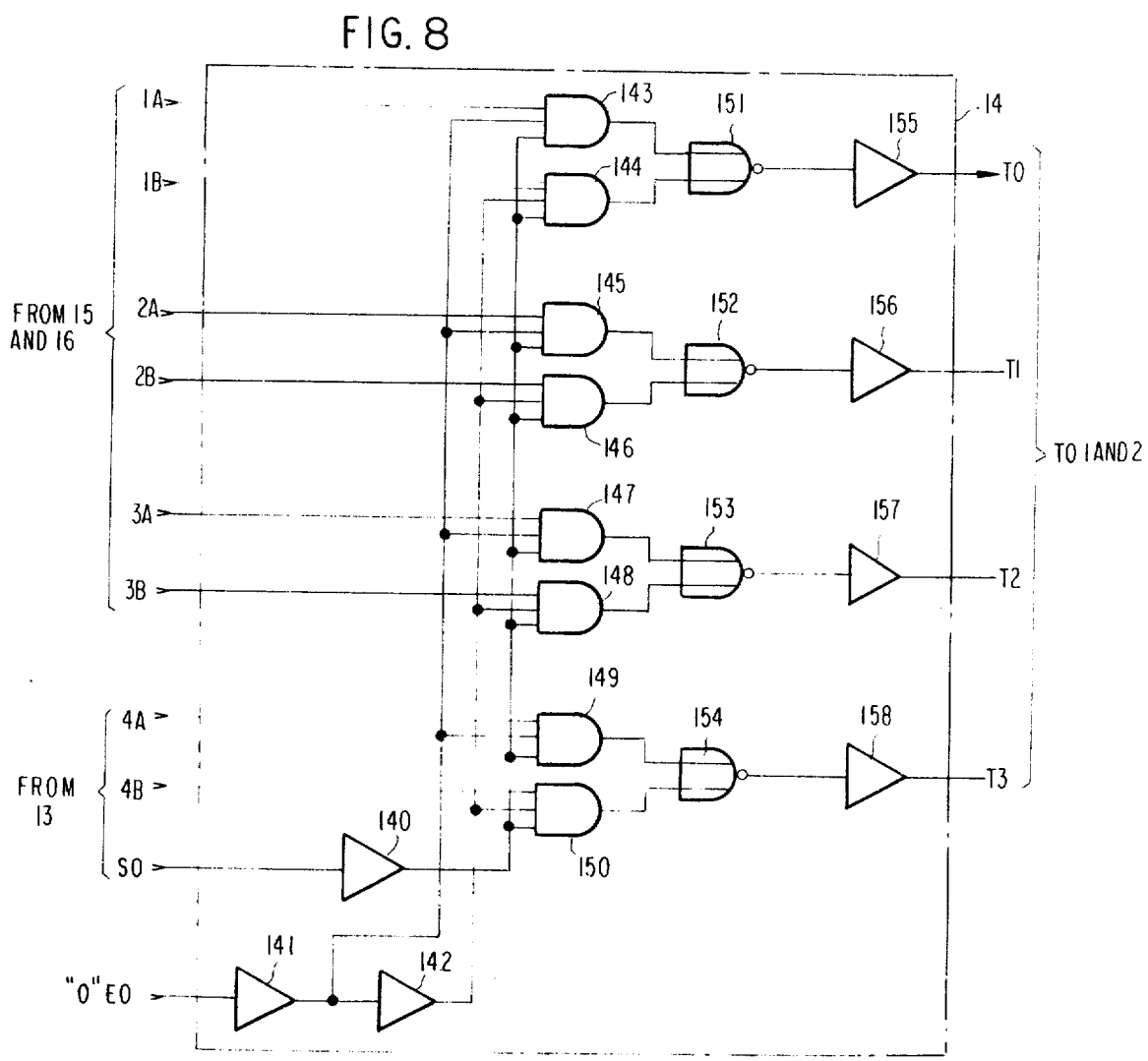
FIG. 8 is a diagram showing details of a part of the circuitry illustrated in FIG. 7.

Referring to FIGS. 1, 7, and 8, the selector 14 is composed of inverters 140 to 142 and 155 to 158, AND gates 143 to 150 and NOR gates 151 to 154. The selector 14 selects either the signal from the circuit 15 or the signal from the circuit 16 in response to a selection command signal. This signal is given from a terminal SO to the selector 14 through the line 211. A selection inhibition signal is supplied from the unit 13 to the processors 1 and 2 through the line 212, regardless of the state of the selection command signal. Receiving the selection inhibition signal, the processors 1 and 2 recognize that both the memory units 4 and 5 have failed.

The operation of the control apparatus having the above construction will be described in detail hereunder.

Figure 9A:
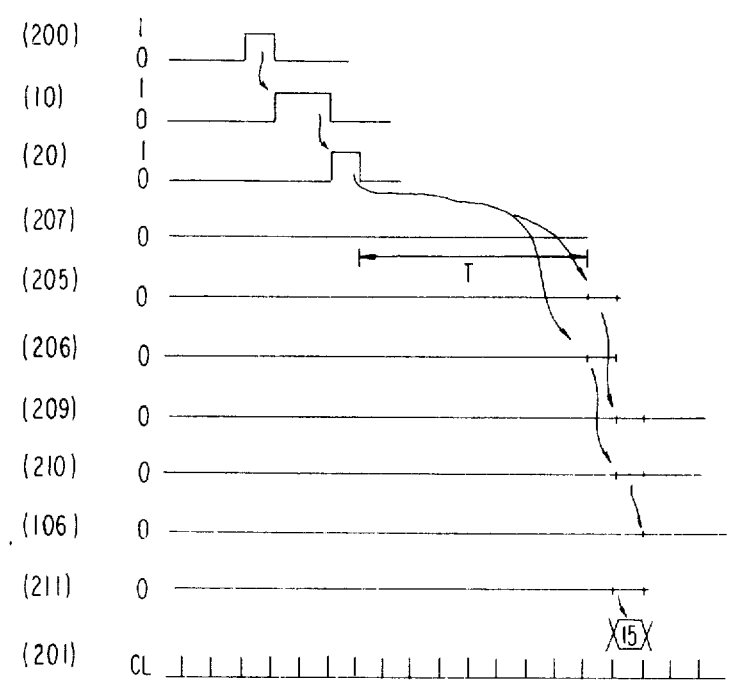
FIGS. 9A to 9C are timing charts demonstrating operations of the embodiment.

Referring to FIGS. 1, 2, 3, and 9A, under normal or failure-free conditions, a memory access request is supplied to and stored in the circuit 10 via the line 200 (see (200) in FIG. 9A). The output of the circuit 10 is supplied to the priority identifying circuit 11 and then stored in the request holding circuit 20 (see (10) and (20) in FIG. 9A). The access request from the circuit 20 is given to the memory units 4 and 5 via the gates 21 and 22, respectively. Upon the lapse of a predetermined memory access time ("T" in FIG. 9A), status signals are stored in the circuits 15 and 16 through the lines 205 and 206, respectively (see (205) and (206) in FIG. 9A). Simultaneously, status error signals supplied to the error holding circuits 17 and 18 are fed to the unit 13 through the lines 209 and 210, respectively (see (209) and (210) in FIG. 9A).

Referring to FIG. 2, where the master designating signal supplied from the circuit 23 via the line 207 is "0" the memory unit 4 shown in FIG. 1 is designated to work as a master memory unit (see (207) in FIG. 9A). It will be noted that the master designating signal is supplied to the F/F 233 shown in FIG. 3 from the outside, such as an input/output processor (not shown), via a line 213. Thereafter, the master designating signal is supplied to the unit 13. If the status signals supplied from the units 4 and 5 through the lines 205 and 206 indicate no error, the status error signal fed from the circuit 17 to the unit 13 through the line 209 is "0" and, therefore, the output of the NAND gate 107 is "1". The output of the NAND gate 102 is "1" and the NAND gate 103 receives at its one input a positive signal corresponding to the master designating signal, i.e., "0" from the gate 101, so that the NAND gate 103 produces "1". The NAND gate 105, therefore, receives "1" at its two inputs to generate "0". This causes the F/F 106 to also generate "0" (see (106) in FIG. 9A). Accordingly, both the NAND gates 108 and 109 generate "1", that is, all the three inputs to the NAND gate 111 are "1", and the output signal or status selection signal of the NAND gate 111 is "0" (see the first row of the Truth Table and (211) in FIG. 9A). The selector 14 thus selects the output of the circuit 15 (see (201) in FIG. 9A). Though not shown in FIG. 1, in a read mode operation, data read from the unit 4 or 5 is also selected by the status selection signal.

Referring to FIGS. 1, 2, 3, and 9B, a read mode operation proceeds as follows in the event the master memory unit 4 has failed. Of the operation represented in FIG. 9B, the procedure up to the supply of a memory access request from the processor 1 to the memory units 4 and 5 through the line 200, the circuit 10, 11, and 20, and gates 21 and 22 is the same as the case with no failure. Due to the failure of the memory unit 4, the status signal fed from the unit 4 through the line 205 is "1" (see (205) in FIG. 9B). This signal is stored in the status holding circuit 15. At the same time, an error status signal is stored in the error holding circuit 17 and fed therefrom to the unit 13 through the line 209 (see (209) in FIG. 9B).

Referring to FIG. 2, since the signal on the line 209 and the negative output of the gate 101 are "1", both the inputs of the NAND gate 102 are "1". The NAND gate 102, therefore, produces "0" and the NAND gate 105 produces "1". As a result, the F/F 106 produces "1" in response to the next clock pulse (see (106) in FIG. 9B) and supplies it to the NAND gates 108 and 109. Supplied to the other input terminal of the NAND gate 108 is a "0" write command signal (see (208) in FIG. 9B). The write command signal is prepared by the control circuit 23 shown in FIG. 3 as follows. First, the output of the inverter 131 is supplied to the F/F 231. The outputs of the F/F 231 and the register 116 are sent to the AND gate 234, whose output is supplied to the shift register 232. The register 232 is triggered to produce a signal after the memory access time T has elapsed. The content of the register 232 is fed as a write command signal to the line 208. While the negative output of the gate 110 is "1" due to the "0" write command signal, the output of the NAND gate 108 becomes "1" due to the "0" output of the F/F 106. This makes the status selection signal fed from the NAND gate 111 to the line 211 "0" (see (211) in FIG. 9B). However, as the status error signal fed through the line 209 becomes "1", the output of the F/F 106 is set to "1", in response to the next clock pulse, because all the inputs to the NAND gate 102 are "1". Therefore, the status selection signal on the line 211 becomes "1" (see the third row of the Truth Table). As a result, the selector 14 supplies the processor 1 with the output signal of the circuit 15, that is, the status signal from the memory unit 4 which has failed at the time of the reading operation, by way of the line 201. In response to the next clock pulse, the status signal from the normal memory unit 5 is fed to the processors 1 and 2 through the line 201 (see (201) in FIG. 9B).

Figure 9B:
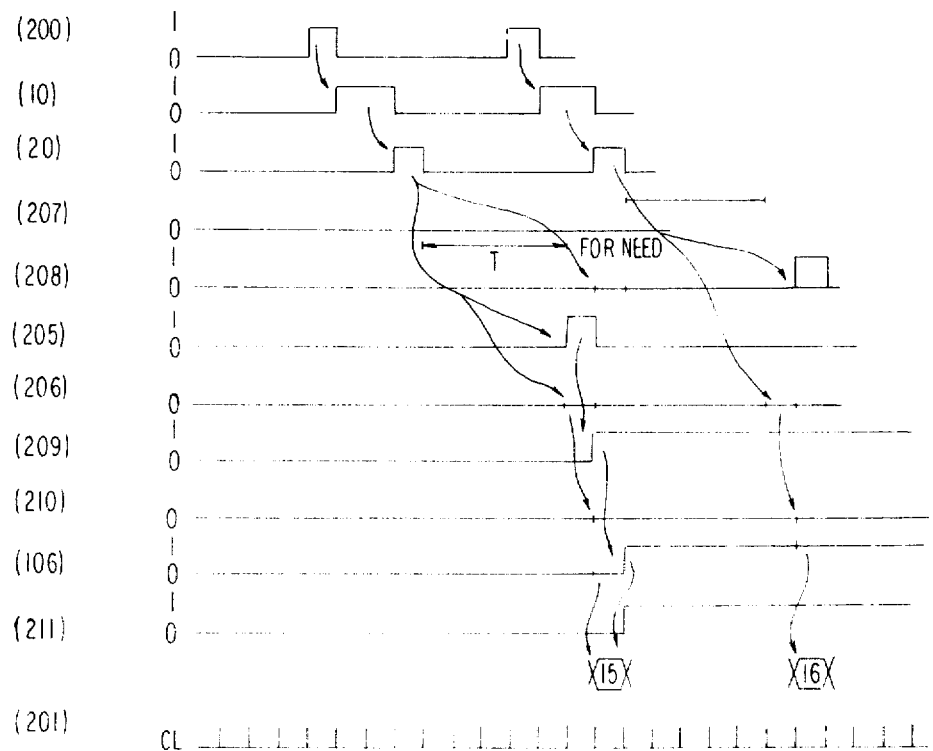
Figure 9C:
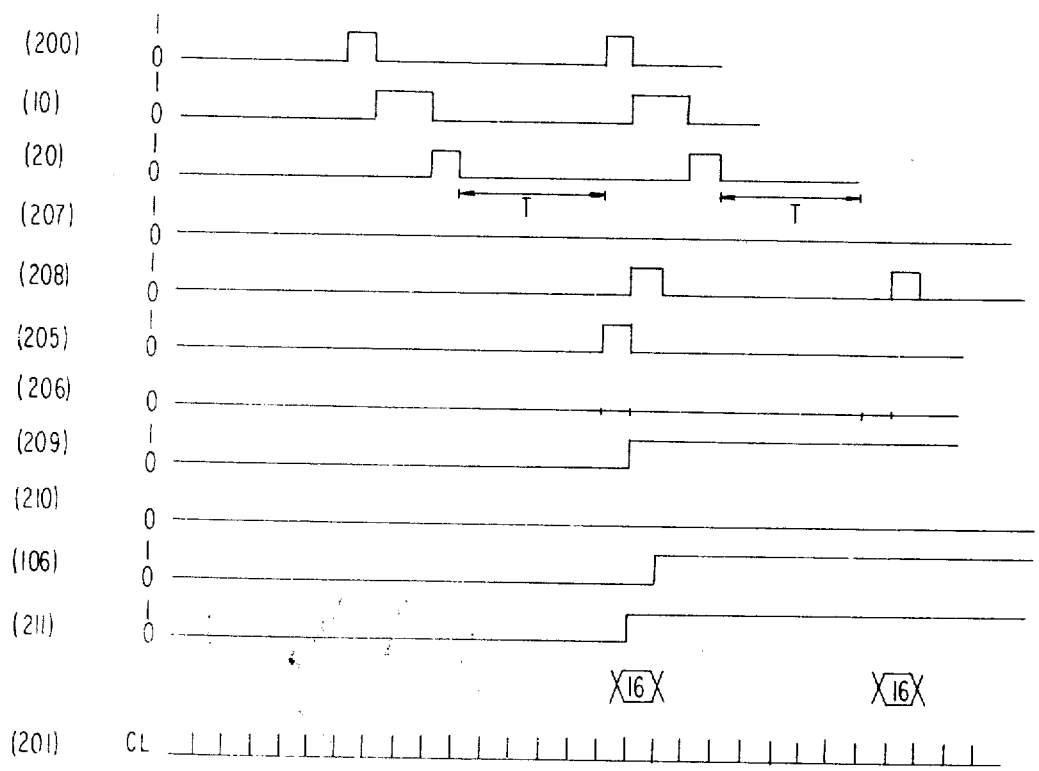

Reference will now be made to FIGS. 1, 2, and 9C for describing in detail a write mode operation in the event of a failure in the master memory unit.

The operation shown in FIG. 9C is common to that described with reference to FIG. 9B up to the step where a memory access request delivered from the processor 1 through the line 200 is given to the memory units 4 and 5 through the circuits 10, 11, and 20, and gates 21 and 22 and, thereafter, status signals are supplied from the units 4 and 5 to the corresponding holding circuits 15 and 16 through the lines 205 and 206 with an error signal fed to the unit 13 through the error holding circuit 17 and line 209 (see (200), (10), (20), (205), (206), and (209) in FIG. 9C). When the write command signal fed through the line 208 of FIG. 2 is "1", negative output of the F/F 106 is "1" and the positive output of the gate 110 is "1" even before the output level of the F/F 106 changes into "1". This makes all the inputs to the NAND gate 107 "1" and, therefore, its output "0", whereby the output of the NAND gate 111 appearing on the line 211 as a status selection signal is made "1" (see (211) in FIG. 9C). Upon the change from "0" to "1" of the output of the F/F 106 (see (106) in FIG. 9C), all the inputs to the NAND gate 109 (if the status error signal on the line 210 is "0") become "1" so that the output of the NAND gate 109 becomes "0" to make the output of the NAND gate 111 or status selection signal "1". Therefore, in a write mode operation, the status selection signal on the line 211 changes into "1" immediately after the status error signal on the line 209 has become "1", as shown on the fourth line of the Truth Table. The selector 14 thus supplies the processor 1 through the line 201 with a status notifying signal which has selected the output of the circuit 16, i.e., the status signal of the error-free memory unit 5 (see (201) in FIG. 9C). Stated another way, no error is reported to the processor 1 which will then continue the processing operation. However, the gate 21 is closed by the negative output of the circuit 17. As a result, any further access to the memory unit 4 by the processor 1 is prevented and, instead, data from the processor 1 is continuously written in the other memory unit 5. It will be seen that the unit 5 has stored all the necessary data during the processing period. Accordingly, the whole system operates without any problem.

In the read mode operation discussed with reference to FIG. 9B, a status selection signal is supplied through the line 211 at a timing one clock pulse behind the supply of an error signal via the line 209. However, in the write mode operation described with reference to FIG. 9C, the supply of a status selection signal via the line 211 occurs simultaneously with the supply of an error signal through the line 209. It will therefore be seen that a given period of system clock pulses can be shortened to speed up the data processing operation. During the read mode operation, a retry occurs as the processor 1 detects an error. In this retry period, the AND gate 21 remains closed as in the previous case so that access is made only to the error-free memory unit 5. Because the status selection signal sent from the unit 13 to the selector 14 through the line 211 has already become "1", data is read from the normal memory unit 5. Thus, during a read mode operation, an error is reported to the processor 1 and a retry can be performed from the processor; during a write mode operation, the operation can be continued using a good memory unit as soon as an error is detected.

When the other memory unit 5 has a failure while the status error signal 209 is "1", the circuit 18 becomes set producing a "1" status error signal 201. Then, the output of the gate 104, i.e., the status inhibition signal fed through the line 212, becomes "1" whereby the error status notifying signal is forcibly returned by the selector 14 to the processor 1. Failure in both the memory units 4 and 5 results in a system-down condition, though the probability of such occurrence is only negligible. Meanwhile, in the event of an error in either the memory unit 4 or the unit 5, it should preferably be removed by a quick and proper mesure. The same procedure as described hereinabove will occur when the master designating signal is "1".

In summary, it will be seen that the present invention can readily control a plurality of memory units with a simple construction and thereby realize a system excellent in performance and reliability. This is achieved by causing a plurality of memory units into simultaneous writing or reading operations and selecting one of them for use. When an error has occurred during a write mode operation, a memory unit without the error is immediately selected alternatively. In the event of an error during a read mode operation, the selection is made, in response to the next clock pulse, to permit a retry from the processor.

What is claimed is:

1. In a data processing system of the type having a processor and a plurality of memory units, each said memory unit providing a status signal indicating either an error condition or a normal operating condition of its respective memory unit, a control apparatus comprising:

memory unit access means for simultaneously accessing said memory units in response to an access request from said processor;

a plurality of error holding circuits, each said error holding circuit continuously producing a status error signal in response to an error indication made by the status signal from a corresponding memory unit;

control means for generating a write command signal in response to a request from said processor;

status selection commanding means responsive to said write command signal from said control means, a status error signal from one of said error holding circuits, and an externally received master designating signal designating one of said memory units as a master memory unit, for producing a status selection signal simultaneously with the generation of said status error signal during a write mode operation, while producing a status selection signal in response to the next clock pulse after the generation of said status error signal during a read mode operation; and status selector means for returning one of the status signals given from said memory units to said processor as a status notifying signal in response to the output of said status selection commanding means.

2. In a data processing system of the type having a processor and at least first and second memory units, each said memory unit providing a status signal indicating either an error condition or a normal operating condition of its respective memory unit, a control apparatus comprising:

memory unit access means responsive to an access request from said processor for simultaneously accessing both of said first and second memory units when both are operating properly and for accessing only one of said first and second memory units during an error condition in the other of said first and second memory units; and status notification means for notifying said processor of the status of said memory units, said status notification means providing to said processor the status signal of one of said first and second memory units when the status signal from said one of said first and second memory units indicates a normal operating condition of said one memory unit and providing to said processor the status signal of the other of said first and second memory units when the status signal of said one of said first and second memory units indicates an error condition, said status notification means switching from said one memory unit status signal to said other memory unit status signal simultaneously in a write mode with an error indication from said one memory unit and switching from said one memory unit status signal to said other memory unit status signal at the first clock pulse subsequent to an error indication from said one memory unit during a read mode operation.

3. A control apparatus as claimed in claim 2, further comprising means for designating either of said first or second memory units as said master memory unit, said processor writing into both of said first and second memory units when said master memory unit is operating normally and writing into the other memory unit when said master memory unit status signal indicates an error condition, said processor reading data from said master memory unit when said master memory unit is operating normally and reading data from the other memory unit when said master memory unit status signal indicates as error condition.

4. A control apparatus as claimed in claim 2, wherein said status notification means comprises:

first and second error holding circuits for providing a status error signal in response to a status signal from a respective one of said first and second memory units indicating an error condition, said error holding circuit continuing to provide said status error signal until reset;

status selection commanding means, responsive to an error signal from one of said error holding circuits indicating an error condition in said one memory unit, for producing a status selection signal simultaneously with the generation of said status error signal during a write mode operation and at the next clock pulse after the generation of said status error signal during a read mode operation; and status selector means for providing to said processor the status signal of said other memory unit in response to said status selection signal.

5. A control apparatus as claimed in claim 2, wherein said memory unit access means accesses neither of said first and second memory units in response to status signals indicating error conditions in both of said memory units, and said status notification means provides to said processor a status inhibition signal indicating error conditions in both of said memory units.

6. A control apparatus as claimed in claim 4, wherein said status selection commanding means is further responsive to a write signal for generating said status selection signal, said control apparatus further comprising control means for generating a write command signal in response to a request from said processor.

* * * * *

UNITED STATES PATENT AND TRADEMARK OFFICE
CERTIFICATE OF CORRECTION

PATENT NO. : 4,488,223

DATED : December 11, 1984

INVENTOR(S) : Yoshinori CHIWAKI

It is certified that error appears in the above-identified patent and that said Letters Patent is hereby corrected as shown below:

Column 1, line 17, "foiled" should be --failed--;

line 31, "a" should be --the--;

line 31, "the" should be --an--;

line 33, "a" should be --the--;

line 33 "the" should be --an--.

Column 3, line 32, "The", should be --Then--.

Column 7, line 2, before "negative" insert --the--.

Column 7, line 66, "mesure" should be --measure--.

Column 9, line 22, "as" should be --an--.

Signed and Sealed this

Thirteenth Day of August 1985

[SEAL]

Attest:

DONALD J. QUIGG

Attesting Officer     Acting Commissioner of Patents and Trademarks